Dec. 11, 1951 L. G. DIXON 2,577,955

TUNING CONTROL MECHANISM

Filed April 2, 1949

INVENTOR.
LESLIE G. DIXON

BY Laurence B. Dodds

ATTORNEY

Patented Dec. 11, 1951

2,577,955

UNITED STATES PATENT OFFICE 2,577,955

TUNING CONTROL MECHANISM

Leslie G. Dixon, Lynbrook, N. Y., assignor to Hazeltine Research, Inc., Chicago, Ill., a corporation of Illinois Application April 2, 1949, Serial No. 85,175

4 Claims. (Cl. 200—17)

Figure 1:
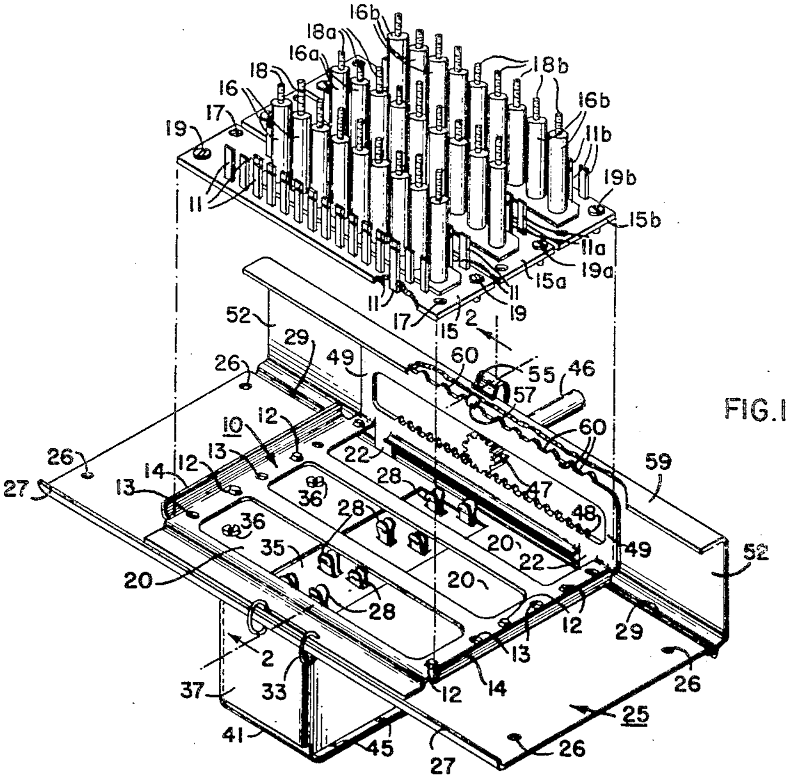

The present invention is directed to tuning control mechanisms and, particularly, to mechanisms for providing step-by-step control of the tuning of radio apparatus to individual ones of a plurality of preselected frequencies. Although the invention has utility in a wide range of applications, it is particularly useful in connection with television receivers and hence will be described in that environment.

Television receivers are presently constructed to receive information transmitted over twelve different television channels positioned in the frequency spectrum between 50 and 216 megacycles. This relatively small number of channels and very wide range of frequencies and also the critical tuning characteristic of a television receiver make it desirable to employ therein individual fixed tuned circuits for each television channel. Selective switching is sometimes employed in the receiver to connect the proper tuned circuits in operative relationship for a selected television channel. This type of switching is ordinarily accomplished by means of a tuning control mechanism having a step-by-step type of operation. A new electrical circuit is selectively established by each step-by-step movement of certain portions of the tuning mechanism with respect to stationary portions thereof.

Since the radio-frequency and intermediate-frequency stages of a television receiver operate at very high frequencies, it is important that the lengths of the leads or connections between the various circuit elements in these stages be very short in order to minimize lead inductances and stray capacitance. Long leads in such circuits are usually characterized by comparatively large inductance and capacitance effects which may undesirably increase circuit losses and impair circuit operation. Long cathode leads for electron tubes, for example, are particularly disadvantageous since the large inductances presented thereby at very high frequencies contribute an apparent resistance to the input circuits of the tubes, which resistance may produce serious loading of the input circuits with consequent loss of gain and selectivity. Accordingly, it is desirable to employ in a television receiver a tuning control mechanism of the type which permits the use of short leads to the various radio-frequency, modulator and oscillator circuits of the receiver.

Some types of television receivers employ a plurality of permeability tuned circuits in the radio-frequency, modulator and local oscillator stages thereof. During the manufacture of such a receiver, these circuits require accurate adjustment to provide the proper tuning of the receiver. Likewise, after the receiver has been in operation in the home for a period of time, a readjustment of the permeability tuned circuits by a radio serviceman may be required. It will be manifest that if these circuits are readily accessible for tuning adjustments, a desirable reduction in manufacturing and servicing costs may be effected. In some prior television and radio receivers, the tuning control mechanisms have so enclosed the electrical circuits associated therewith that the adjacent of these circuits has been difficult.

Other prior tuning control mechanisms are of the rotary or turret type and have a rather large number of electrical switches associated therewith. The torque required to operate these arrangements to control these switches is often so great that the tuning control knobs sometimes break or fail properly to grip the actuating shafts. Obviously such a failure can be extremely annoying to the owner of a television receiver.

It is an object of the invention, therefore, to provide a new and improved tuning control mechanism which avoids one or more of the disadvantages of prior tuning control mechanisms.

It is an object of the invention, therefore, to provide a new and improved tuning control mechanism which permits easy access to the electrical circuits associated therewith for the purpose of making tuning adjustments of those circuits.

It is another object of the invention to provide a new and improved tuning control mechanism which permits the selective use therewith of individual high-frequency electrical circuits having short connections between the various electrical components of individual ones of those circuits.

It is a further object of the invention to provide a new and improved tuning control mechanism which is relatively simple in construction, inexpensive to manufacture and yet is characterized by its high reliability of operation over extended periods of time.

It is an additional object of the invention to provide a new and improved tuning control mechanism, for a television tuner, which permits the use of mass-production techniques in the production of the television tuner to reduce the manufacturing costs thereof without impairing the quality of the tuner.

In accordance with a particular form of the invention, a mechanism adapted to provide step-by-step control of the tuning of a radio apparatus to individual ones of a plurality of preselected frequencies comprises a planar frame member, having at least one elongated aperture, adapted to support thereon in spaced linear relation a plurality of electrical contacts arranged to extend through the aperture and to be coupled to individual ones of a plurality of tuning means preadjustable to individual ones of the aforesaid frequencies. The tuning control mechanism also includes a substantially L-shaped planar member of sheet material adapted to support at least one electrical contact and providing support for the first-mentioned member. The L-shaped member has an aperture for the aforesaid one electrical contact to extend therethrough and includes at least one guide element for permitting linear relative movement between the members to effect engagement between the aforesaid one electrical contact and individual ones of the first-mentioned contacts selectively to include individual ones of the plurality of tuning means in an electrical circuit. The tuning control mechanism further includes means including resilient stop means for maintaining the first-mentioned member in operative engagement with the guide element and for arresting the relative movement at any selected one of a plurality of relative positions of the members to effect selective engagement between the aforesaid one electrical contact and an individual one of the first-mentioned contacts, thereby to provide step-by-step control of the tuning of the radio apparatus.

For a better understanding of the present invention, together with other and further objects thereof, reference is had to the following description taken in connection with the accompanying drawing, and its scope will be pointed out in the appended claims.

Figure 2:
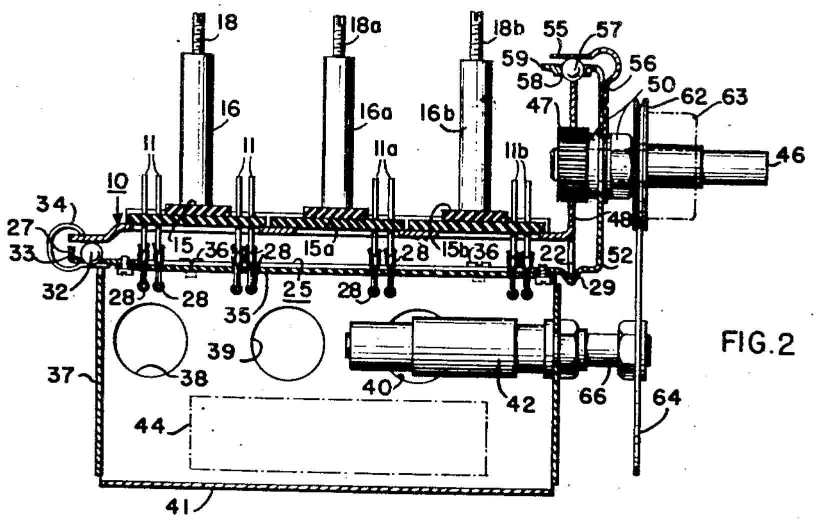

Referring now to the drawing, Fig. 1 is a perspective view of a tuning control mechanism for a television receiver and embodying the present invention in a particular form, certain of the tuning elements of the receiver being detached from and illustrated above the control mechanism; and Fig. 2 is a sectional view of the tuning control mechanism of Fig. 1 taken along the line 2—2 thereof, the tuning elements associated with the mechanism, however, being illustrated mounted in operative relation on the control mechanism.

Referring now more particularly to Fig. 1 of the drawing, the mechanism there represented provides step-by-step control of the tuning of a television receiver to individual ones of a plurality of preselected frequencies and comprises a planar member or carriage 10, preferably of sheet metal, for supporting thereon in spaced linear relation a plurality of male electrical contacts 11, 11, $11_a$, $11_a$ and $11_b$, $11_b$. The carriage 10 includes means, comprising a plurality of aligning pins 12, 12 and a corresponding plurality of threaded apertures 13, 13, for detachably supporting the electrical contacts just mentioned in a manner to be described subsequently. The carriage 10 has an upturned, transverse, stiffening rib 14 at each end thereof. The contacts 11, 11 are arranged in four parallel rows which extend longitudinally on a strip 15 of suitable insulating material such as Bakelite. The contacts just mentioned are secured by staking in suitable apertures in the strip 15, and are arranged to project from the upper and lower sides thereof. A row of vertically extending inductors 16, 16 is also suitably mounted on the strip 15. Each inductor includes a suitable core member attached to an adjusting screw 18 for adjusting the inductance of the inductor in the well-known manner. Individual terminals of the inductors 16, 16 are arranged to be coupled to individual electrical contacts 11, 11 (in a manner purposely not shown to simplify the illustration), thus forming a portion of individual pretuned input circuits of the radio-frequency stage of a television receiver. The strip 15 includes at each end thereof an aperture 17 adapted for quick and convenient alignment with corresponding ones of the aligning pins 12, 12 on the carriage 10. The strip 15 also includes a screw 19 mounted in an aperture at each end thereof for threaded engagement with a corresponding aperture 13 on the carriage to permit the strip 15 to be secured to the carriage.

Similarly, double rows of contacts $11_a$, $11_a$ and $11_b$, $11_b$ are mounted, respectively, in insulating strips $15_a$ and $15_b$. Elements on the strips $15_a$ and $15_b$ corresponding generally to those on the strip 15 are identified by the same reference numerals with the suffix "*a*" or "*b*," as the case may be. The electrical contacts and the inductors on the strips $15_a$ and $15_b$ are, respectively, adapted to be connected in the modulator and local oscillator circuits of the television receiver.

The carriage 10 further includes three elongated apertures 20, 20 which permit the depending portions of the contacts mentioned above to pass therethrough for a purpose which will be made clear hereinafter. Thus, it will be seen that the carriage 10 is arranged to support thereon a plurality of longitudinal rows of electrical contacts arranged to be coupled to individual ones of a corresponding plurality of longitudinal rows of tuning means, comprising the inductors 16, 16, $16_a$, $16_a$ and $16_b$, $16_b$, adjustable to individual ones of the preselected frequencies. The carriage 10 has a pair of spaced lugs 22, 22 adjacent one end thereof and extending perpendicular to the plane of the carriage for a purpose to be made clear subsequently. The contacts 11, 11, $11_a$, $11_a$ and $11_b$, $11_b$ are also so arranged on their respective insulating strips 15, $15_a$ and $15_b$ that they also form transverse rows of electrical contacts.

The tuning control means also includes a substantially L-shaped planer member of sheet material such as metal, and includes means for detachably supporting thereon at least one transverse row of electrical contacts, in particular two rows of female electrical contacts 28, 28. The planar member also provides support for the carriage 10. This L-shaped member comprises a very simple chassis 25 adapted for attachment in any convenient manner, as by suitable fasteners extending through apertures 26, 26, to the main chassis of the television receiver. Thus the chassis 25 may form a convenient sub-chassis of a television receiver or may be so constructed as to be part of the main chassis thereof having mounted thereon the so-called "front end section" of the receiver. The chassis 25 has a small longitudinal flange 27 along one edge thereof for imparting rigidity to the chassis. The member 25 also includes at least one guide element in the form of a longitudinal groove 29 for engaging the lugs 22, 22 and for permitting bidirectional linear relative movement between the members 10 and 25 to effect engagement between the contacts 28, 28 and corresponding pairs of contacts 11, 11, $11_a$, $11_a$ and $11_b$, $11_b$ associated with the carriage 10, selectively to include individual ones of the tuning means 16, $16_a$ and $16_b$ of each row thereof in an electrical circuit. A ball bearing 32 (see Fig. 2) mounted in a recess 33 in the chassis near the flange 27 thereof provides a bearing support for one end of the carriage 10. A clip 34 of spring steel is preferably employed to assist in maintaining the carriage 10 in engagement with the ball bearing 32.

The female electrical contacts 28, 28 are mounted on and extend through suitable apertures in a sheet 35 of insulating material. These contacts extend into a shielding compartment formed by a sheet-metal casing 37 secured to the carriage 25 by suitable means such as screws 36, 36 (see also Fig. 2). The casing 37 not only forms a magnetic shield but also comprises a sub-chassis for mounting a radio-frequency amplifier tube 38, a modulator tube 39 and a local or heterodyne oscillator tube 40, the tubes being represented diagrammatically as circles to simplify the illustration. The casing 37 also supports an adjustable trimmer condenser 42. The contacts 28, 28 are suitably connected (in a manner which has not been shown to simplify the drawing) to various other elements connected in circuit in the compartment formed by the casing 37 and a cover plate 41, these elements being represented conveniently by a broken-line rectangle 44. The cover plate 41 is detachably secured to the casing 37 by screws 45, 45 to permit access to the electrical components within the casing.

The tuning control means further includes a first control means for producing bidirectional relative movement between the carriage 10 and the chassis 25. This means includes a rotatable shaft 46 carrying on one end thereof a pinion gear 47 for operative engagement with a rack gear 48 formed on an extension 49 to the carriage 10, the extension being normal to the plane of the carriage. The shaft 46 is journaled in a conventional manner in a sleeve arrangement extending through an aperture in a flange portion 52 of the chassis 25 and is secured to the flange portion in a conventional manner as by staking (see Fig. 2).

The tuning control arrangement also includes a resilient stop means of the detent type for maintaining the carriage 10 in operative engagement with the longitudinal groove 29 of the chassis 25 and for arresting the movement of the carriage relative to the chassis at any selected one of a plurality of relative positions of the members 10 and 25 to effect selective engagement between individual contacts 28 of the two transverse rows of contacts and individual ones of the contacts 11, 11a and 11b of each of the longitudinal rows of contacts, thereby to provide step-by-step control of the tuning of the television receiver. This means preferably comprises a flat spring finger 55 having a depending portion 56 secured to the flange portion 52 of the chassis 25 by means of the nuts 50, 50. The finger 55 resiliently engages a stop element comprising a ball bearing 57 resting in an aperture 58 in a horizontal member 59 of the flange portion 52. The finger 55 yieldingly urges the ball bearing 57 into engagement with individual notches 60 formed in one edge of the extension 49 of the carriage. It is customary to provide the extension 49 with a different notch for each channel to which the television receiver is to be tuned.

The tuning control mechanism additionally includes a second control means having a portion coaxial with the shaft 46 for providing continuous auxiliary adjustment of another row of the tuning means, specifically the tuning means including the row of inductors 16b, 16b in the local oscillator circuit of the television receiver. This second control means comprises a disc 62 (see Fig. 2) freely rotatable on the shaft 46 and actuated by a control knob 63 also freely rotatable on the shaft. The disc 62 operatively engages the periphery of a second disc 64 mounted on a shaft 66 rotatably mounted in the casing 37. The shaft 66 is associated with the adjustable trimmer condenser 42 in the local oscillator circuit of the receiver, which circuit selectively includes individual ones of the inductors 16b, 16b.

Considering now the operation of the tuning control mechanism just described, rotation of the shaft 46 actuates the carriage 10 by way of the rack and pinion gears 48, 47 thereby moving the carriage longitudinally of the chassis 25. The serrated upper edge of the extension 49 intermittently elevates the ball bearing 57 against the resistances of the spring finger 55 during this movement of the carriage, and the ball bearing is adapted to come to rest in a selected one of the notches 60, 60 when the rotation of the shaft 46 is discontinued. Each notch co-operating with the ball bearing 57 and the spring finger 55 thus constitutes a detent mechanism for arresting the movement of the carriage 10 at any selected one of a plurality of relative positions of the carriage and the chassis 25. It will thus be seen that the rotation of the shaft 46 is effective to provide a step-by-step control of the movement of the carriage. At each position of rest of the carriage, engagement is made between contacts of predetermined pairs of transverse rows of contacts 11, 11a and 11b and the two rows of contacts 28, 28 mounted on the insulating strip 35 attached to the chassis 25 so that desired electrical circuits are established through these various contacts. Thus, for each position of rest of the carriage and, hence, for each notch 60 on the extension 49 of the carriage, electrical circuits are completed which are effective to tune the television receiver to a selected one of a plurality of television channels. The circuit connections established for each of these carriage positions are positive and extremely short and, hence, the lead inductances thereof are reduced to a practical minimum value.

The detent mechanism including the spring finger 55, the ball bearing 57 and the notched extension 49 is also effective at all times to maintain the carriage 10 in operative engagement with the chassis 25. This detent mechanism serves to maintain the spaced lugs 22, 22 in sliding engagement with the longitudinal groove 29 of the chassis and largely controls the amount of force required to actuate the carriage from one position to another.

The discs 62, 64 and the shaft 66 permit a vernier tuning of the adjustable trimmer condenser 42 in the local oscillator circuits of the television receiver, should such adjustment be necessary.

From the foregoing description, it will be apparent that a tuning control mechanism embodying the present invention permits the selective use therewith of individual high-frequency electrical circuits having short connections between the various electrical components thereof. It will also be clear that a tuning control mechanism in accordance with the present invention can be fabricated quite readily and inexpensively largely from flat metallic sheet material. It will also be manifest that a tuning control mechanism embodying the present invention permits very easy access to any electrical circuits which may be associated therewith for the purpose of making tuning adjustments of those circuits. An important feature of a tuning control mechanism embodying the present invention resides in the fact that various electrical circuit arrangements for use therewith, for example the "front end section" of a television receiver, can be manufactured as a unit and quickly mounted in position on the carriage of the mechanism. This, in turn, permits an appreciable reduction to be effected in the manufacturing and assembling costs of television receiver tuners.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A mechanism adapted to provide step-by-step control of the tuning of a radio apparatus to individual ones of a plurality of preselected frequencies comprising: a planar frame member, having at least one elongated aperture, adapted to support thereon in spaced linear relation a plurality of electrical contacts arranged to extend through said aperture and to be coupled to individual ones of a plurality of tuning means preadjustable to individual ones of said frequencies; a substantially L-shaped planar member of sheet material adapted to support at least one electrical contact and providing support for said first-mentioned member, said L-shaped member having an aperture for said one electrical contact to extend therethrough and including at least one guide element for permitting linear relative movement between said members to effect engagement between said one electrical contact and individual ones of said first-mentioned contacts selectively to include individual ones of said plurality of tuning means in an electrical circuit; and means including resilient stop means for maintaining said first-mentioned member in operative engagement with said guide element and for arresting said relative movement at any selected one of a plurality of relative positions of said members to effect selective engagement between said one electrical contact and an individual one of said first-mentioned contacts, thereby to provide step-by-step control of the tuning of said apparatus.

2. A mechanism adapted to provide step-by-step control of the tuning of a radio apparatus to individual ones of a plurality of preselected frequencies comprising: a planar frame member including means adapted detachably to support thereon in spaced linear relation a plurality of electrical contacts arranged to be coupled to individual ones of a plurality of tuning means preadjustable to individual ones of said frequencies; a substantially L-shaped planar member of sheet material including means adapted detachably to support at least one electrical contact and providing support for said first-mentioned member, said L-shaped member including at least one guide element for permitting linear relative movement between said members to effect engagement between said one electrical contact and individual one of said first-mentioned contacts selectively to include individual ones of said plurality of tuning means in an electrical circuit; and means including resilient stop means for maintaining said first-mentioned member in operative engagement with said guide element and for arresting said relative movement at any selected one of a plurality of relative positions of said members to effect selective engagement between said one electrical contact and an individual one of said first-mentioned contacts, thereby to provide step-by-step control of the tuning of said apparatus.

3. A mechanism adapted to provide step-by-step control of the tuning of a radio apparatus to individual ones of a plurality of preselected frequencies comprising: a planar frame member, including a pair of spaced lugs, adapted to support thereon in spaced linear relation a plurality of electrical contacts arranged to be coupled to individual ones of a plurality of tuning means preadjustable to individual ones of said frequencies; a substantially L-shaped planar member of sheet material adapted to support at least one electrical contact and including a guide groove engaging said lugs and providing support for said first-mentioned member, said lugs and said guide groove permitting linear relative movement between said members to effect engagement between said one electrical contact and individual ones of said first-mentioned contacts selectively to include individual ones of said plurality of tuning means in an electrical circuit; and means including resilient stop means for maintaining said lugs of said first-mentioned member in operative engagement with said guide groove and for arresting said relative movement at any selected one of a plurality of relative positions of said members to effect selective engagement between said one electrical contact and an individual one of said first-mentioned contacts, thereby to provide step-by-step control of the tuning of said apparatus.

4. A mechanism adapted to provide step-by-step control of the tuning of a radio apparatus to individual ones of a plurality of preselected frequencies comprising: a planar frame member adapted to support thereon in spaced linear relation a plurality of electrical contacts arranged to be coupled to individual ones of a plurality of tuning means preadjustable to individual ones of said frequencies; a substantially L-shaped planar member of sheet material adapted to support at least one electrical contact and providing support for said first-mentioned member, said L-shaped member including at least one guide element for permitting linear relative movement between said members to effect engagement between said one electrical contact and individual ones of said first-mentioned contacts selectively to include individual ones of said plurality of tuning means in an electrical circuit; a pinion gear supported by said second-mentioned member; said first-mentioned member including a rack gear operatively engaging said pinion gear for producing therewith said relative movement; and means including resilient stop means for maintaining said first-mentioned member in operative engagement with said guide element and for arresting said relative movement at any selected one of a plurality of relative positions of said members to effect selective engagement between said one electrical contact and an individual one of said first-mentioned contacts, thereby to provide step-by-step control of the tuning of said apparatus.

LESLIE G. DIXON.

REFERENCES CITED

The following references are of record in the file of this patent:

UNITED STATES PATENTS

| Number | Name | Date |
|---|---|---|
| 1,907,964 | Hand | July 7, 1931 |
| 1,910,645 | Soreng | May 23, 1933 |
| 2,427,745 | Roger-Petit | Sept. 23, 1947 |